United States Patent [19]

Shieh et al.

[11] Patent Number: 5,612,228

[45] Date of Patent: Mar. 18, 1997

[54] METHOD OF MAKING CMOS WITH ORGANIC AND INORGANIC SEMICONDUCTING REGION

[75] Inventors: Chan-Long Shieh, Paradise Valley, Ariz.; Donald E. Ackley, Lambertville, N.J.

[73] Assignee: Motorola, Schaumburg, Ill.

[21] Appl. No.: 634,599

[22] Filed: Apr. 24, 1996

[51] Int. Cl.$^6$ .......................... H01L 21/84; H01L 51/40
[52] U.S. Cl. .................. 437/1; 437/34; 437/57; 257/40
[58] Field of Search .................. 437/1, 34, 57; 257/40

[56] References Cited

U.S. PATENT DOCUMENTS

| | | | |
|---|---|---|---|
| 5,107,308 | 4/1992 | Koezuka et al. | |
| 5,347,144 | 9/1994 | Garnier et al. | 257/40 |
| 5,500,537 | 3/1996 | Tsumura et al. | 257/40 |
| 5,543,631 | 8/1996 | Weinberger | 257/40 |

FOREIGN PATENT DOCUMENTS 3-255669  11/1991  Japan ......................................... 437/1

OTHER PUBLICATIONS

Hamann et al., "Electrical Properties of Organic/Inorganic Thin Film Sandwiches", Thin Solid Films, 36 No. 1, pp. 81–84 Jul. 15, 1976.

Primary Examiner—John Niebling
Assistant Examiner—Richard A. Booth
Attorney, Agent, or Firm—Eugene A. Parsons

[57] ABSTRACT

A method of fabricating a thin film transistor device including forming first and second spaced apart control electrodes on a surface of a supporting substrate and forming a dielectric layer over the control electrodes. Inorganic and organic thin film transistors are formed on the dielectric layer, one on each control electrode. The inorganic and organic thin film transistors are n-type and p-type conductivity, respectively, and may be integrated into a complementary circuit. Also, the thin film transistor device is fabricated at relatively low temperatures so that plastic supporting substrates can be utilized.

18 Claims, 2 Drawing Sheets

5,612,228

METHOD OF MAKING CMOS WITH ORGANIC AND INORGANIC SEMICONDUCTING REGION

FIELD OF THE INVENTION

The present invention pertains to thin film transistors and more particularly to the fabrication of thin film transistors.

BACKGROUND OF THE INVENTION

In the semiconductor industry, one of the most widely used types of circuitry are the CMOS, or complementary, circuits. Complementary circuits generally include an n-conduction transistor and a p-conduction transistor in series. This connection results in very low static power consumption and, as a result, the circuits use very low power and are very efficient.

The major problem with these circuits is the number of process steps required during fabrication. Each of the two types of transistors requires different materials in the construction. For example, the process must start with some type of semiconductor substrate, generally n-conduction. The p-conduction transistor is formed in the n-conduction semiconductor substrate in a normal fashion. A n-conduction transistor is formed by first providing a large p-conduction tub in the semiconductor substrate and then fabricating the n-conduction transistor in the p-conduction tub. This process requires many extra steps and is, therefore, relatively expensive and labor intensive. Also, additional substrate area is required for deep implants and the like to protect the structure from random and inadvertent p-n-p-n diodes which are formed between the two types of transistors.

Also, in many instances it would be desirable to fabricate semiconductor circuits on materials, or supporting substrates, different than semiconductor substrates. In a typical example, there is presently a great deal of interest in providing financial cards, such as credit and debit cards, with semiconductor circuits which can perform various functions dealing with the use of the card. However, financial cards are generally formed of flexible plastic with a relatively low melting point and the fabrication of semiconductor circuits on semiconductor substrates, or other substrates, requires relatively high temperatures. Thus, at present the semiconductor substrates must be fabricated on semiconductor substrates and then mounted on the financial cards. This is unsatisfactory because of the difference in temperature coefficients and the potential flexing of the cards, both of which are highly detrimental to the safe and continued operation of the semiconductor circuit.

Accordingly, it would be highly advantageous if complementary semiconductor circuits could be formed with fewer steps and at lower temperatures.

It is a purpose of the present invention to provide a new and improved method of fabricating inorganic and organic transistors on a common substrate.

It is a further purpose of the present invention to provide a new and improved method of fabricating complementary transistors at relatively low temperatures and with a substantial reduction in the number of processing steps.

It is another purpose of the present invention to provide new and improved complementary transistors which can be fabricated on supporting substrates such as plastic and the like.

SUMMARY OF THE INVENTION

The above problems and others are at least partially solved and the above purposes and others are realized in a method of fabricating a thin film transistor device including forming an inorganic thin film transistor and an organic thin film transistor on a supporting substrate. The inorganic thin film transistor includes a first control terminal in contact with a dielectric layer, an inorganic semiconducting region in contact with the dielectric layer and a first pair of current carrying terminals in contact with the inorganic semiconducting region and spaced on either side of the first control terminal. The organic thin film transistor includes a second control terminal in contact with the dielectric layer, an organic semiconducting region in contact with the dielectric layer and a second pair of current carrying terminals in contact with the organic semiconducting region and spaced on either side of the second control terminal.

In a preferred embodiment the first and second control terminals are formed in the same fabrication step on a supporting substrate, a common dielectric layer is deposited and the inorganic and organic thin film transistors are completed with the first and second pairs of current carrying terminals being formed in a common fabrication step.

Also, in a preferred embodiment the inorganic thin film transistor is formed with n-type conductivity and the organic thin film transistor is formed with p-type conductivity. The inorganic and organic thin film transistors may be integrated into a complementary circuit.

BRIEF DESCRIPTION OF THE DRAWINGS

Referring to the drawings.

DESCRIPTION OF THE PREFERRED EMBODIMENTS

Figure 1:
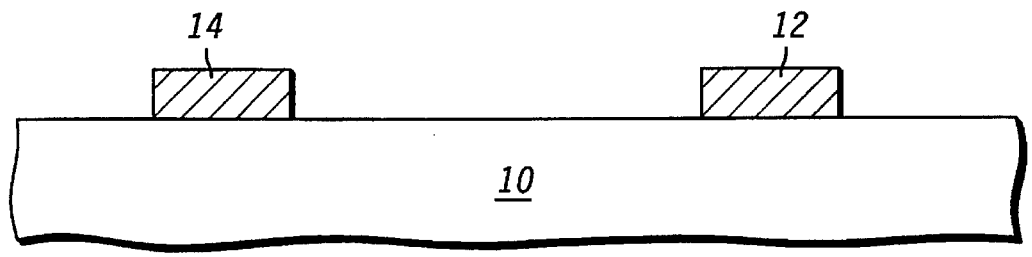
FIGS. 1 through 5 are simplified cross-sectional views illustrating various steps in the fabrication of a thin film transistor device in accordance with the present invention.

Turning now to the drawings, FIGS. 1–5 illustrate various steps in a method of fabricating a thin film transistor (TFT) device in accordance with the present invention. Referring specifically to FIG. 1, a supporting substrate 10 is illustrated, which may be formed of virtually any material including inorganic materials such as silicon, ceramic, glass and organic plastic materials such as poly(vinylene chloride)s, polyolefins, polyesters, or polyimide is used to support the embodied TFT device. However, the present invention is particularly useful for plastic substrates, since the temperature required to process the TFTs is generally less than 300° C.

First and second spaced apart control electrodes 12 and 14, respectively, are formed on the upper surface of supporting substrate 10. In a preferred embodiment this is accomplished by depositing gate metal, such a stable metal, a metal alloy, or even a transparent conductor such as indium-tin-oxide. Typical examples of a metal and a metal alloy which are convenient to use are aluminum (Al) and titanium-tungsten (TiW). Generally, the material selected and the deposition process for control electrodes 12 and 14 will depend upon the specific application and the material forming supporting substrate 10. For example, if supporting substrate 10 is plastic, the material forming control electrodes 12 and 14 should be able to be deposited at a temperature below the glass transition point of the plastic.

Control electrodes 12 and 14 are formed by depositing a layer of metal and then patterning the layer to define and position the electrodes, although lift-off or any of the other techniques used in the semiconductor industry can be utilized. One of the features of this invention is the fact that control electrodes 12 and 14 are formed of similar material and in a common step. Electrodes 12 and 14 are spaced apart so as to be positioned at a specific location for the further fabrication of thin film transistors thereon. It should be understood that control electrodes 12 and 14 will generally have an external connection thereto for connections to other circuits, which external connection is not shown in the figures for convenience. This external connection can be formed at the same time that control electrodes 12 and 14 are patterned and will generally extend to an accessible area of supporting substrate 10.

Figure 2:
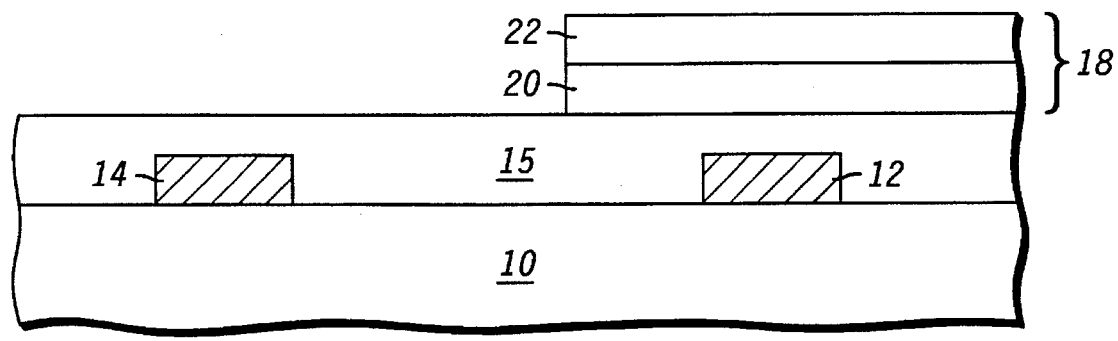
Figure 3:
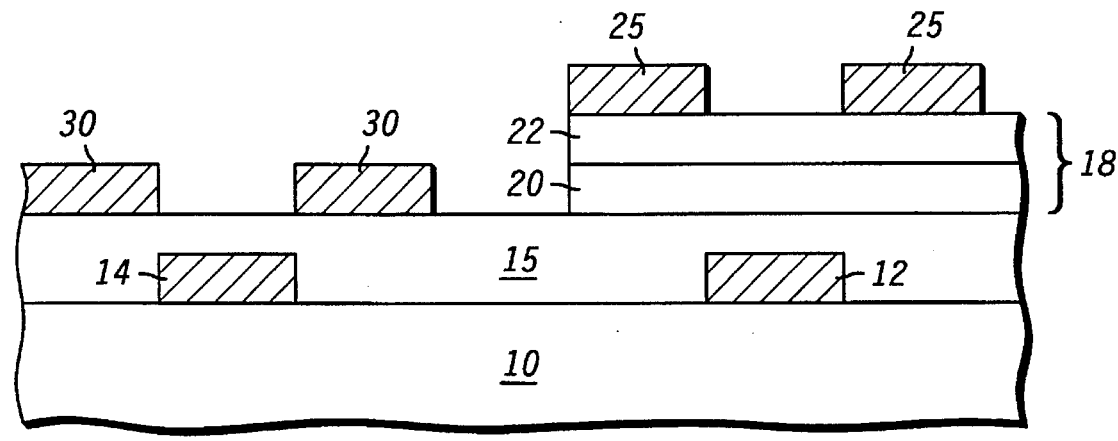

Referring now to FIG. 2, a dielectric layer 15 is formed on the surface of supporting substrate 10 and in overlying relationship to control electrodes 12 and 14. Layer 15 may be formed of any convenient dielectric, such as SiOx, SiNx and AlOx, as well as organic dielectric media such as polyimides, polyacrylates, poly(vinyl chloride), perfluoropolymers and liquid crystal polymers. An inorganic semiconducting region 18 is formed on dielectric layer 15. Inorganic semiconducting region 18 and dielectric layer 15 are formed of any compatible material, in this embodiment dielectric layer 15 includes silicon nitride (SiNx). In this preferred embodiment, inorganic semiconducting region 18 includes an undoped layer 20 of a convenient semiconducting material, such as one of hydrogenated amorphous silicon (a-Si:H), amorphous silicon (a-Si), polysilicon, hydrogenated amorphous silicon carbide (a-SiC:H), amorphous or diamond-like carbon and cadmium selenide (CdSe). Inorganic semiconducting region 18 further includes a doped layer 22 of a convenient semiconducting material, which is doped to provide a good electrical connection for external current carrying contacts, to be described presently. Doped layer 22, in this embodiment, is positioned on layer 18 and includes one of hydrogenated amorphous silicon (a-Si:H), amorphous silicon (a-Si), hydrogenated amorphous silicon carbide (a-SiC:H), amorphous or diamond-like carbon, poly-silicon, and cadmium selenide (CdSe). Further, a-Si TFTs are easier to fabricate as n-channel or n-conduction TFTs, and, therefore, layer 22 is doped for n-conduction in this preferred embodiment.

A pair of current carrying ohmic contacts or terminals 25 are deposited on the upper surface of inorganic semiconducting region 18 (in this embodiment, layer 22) and spaced apart so as to be positioned on opposite sides of control electrode 12. In the same process step, a pair of current carrying ohmic contacts or terminals 30 are deposited on the upper surface of dielectric layer 15 and spaced apart so as to be positioned on opposite sides of control electrode 14. It will be understood that pairs of current carrying electrodes 25 and 30 each generally include a source and drain and, as is common in these type of devices, either electrode of the pair may be used as either a source or a drain.

Pairs of current carrying electrodes 25 and 30 are not only formed in a common step, but they are formed of the same material, which is any material compatible with both semiconducting region 18 and dielectric layer 15. In a preferred embodiment current carrying electrodes 25 and 30 are formed of gold/chromium (Au/Cr). The chromium (Cr) makes a good electrical ohmic contact with doped layer 22 of a-Si and the gold (Au) is deposited on top of the chromium to make a good electrical ohmic contact with organic semiconductor material, to be explained. It will of course be understood that the chromium can be replaced with any good ohmic contact metal that is compatible with the doped semiconducting material of layer 22 and the gold can be replaced with any good ohmic contact metal, generally with a high work function, that is compatible with the organic semiconductor material.

Figure 4:
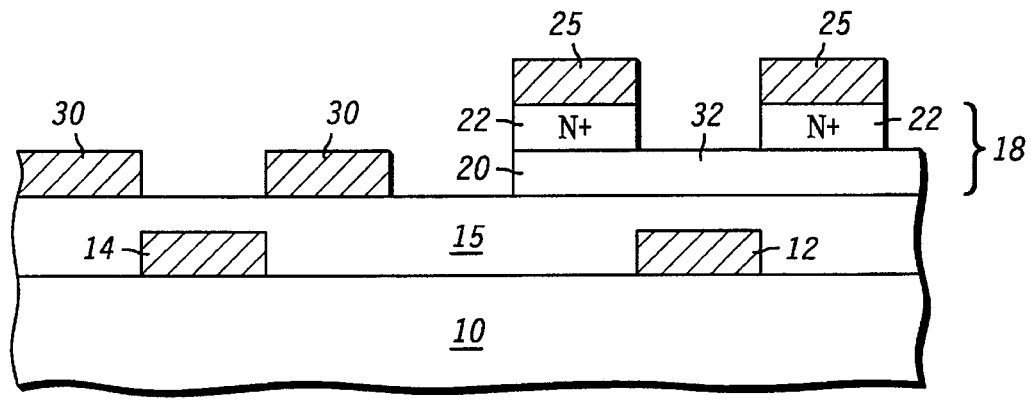

Turning now to FIG. 4, current carrying electrodes 25 are used as a mask to pattern layer 22 into islands beneath electrodes 25. Utilizing this technique, inorganic semiconducting region 18 defines an inorganic current channel 32 between current carrying terminals 25 and in overlying relationship to control electrode 12. Thus, an inorganic TFT 35 is formed. It should be noted that region 18 and terminals 25 of TFT 35 are, or can be, formed at relatively low temperatures, generally below 300° C., so that this procedure is compatible with the fabrication of TFT 35 on a plastic substrate, if desired.

Figure 5:
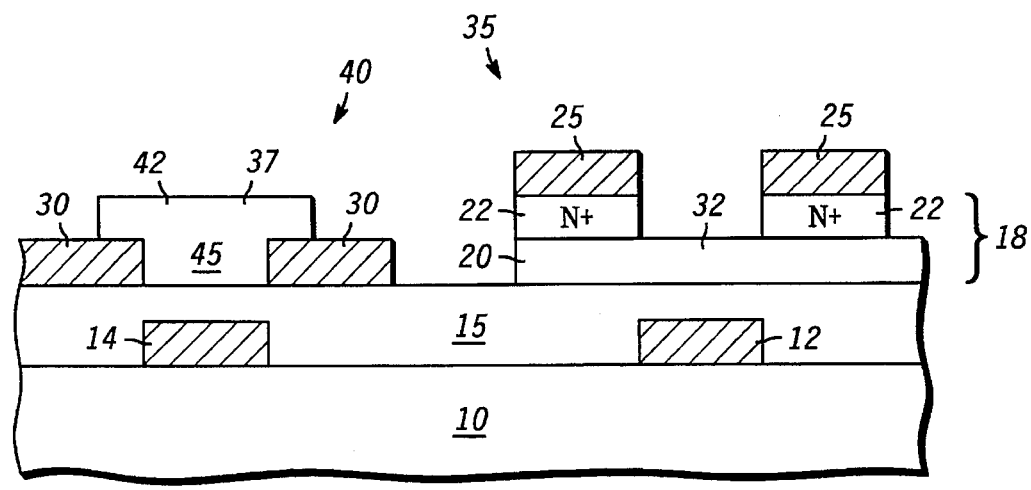
Figure 6:
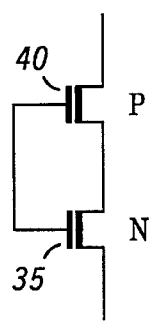
FIG. 6 is a schematic view of a complementary pair of thin film transistors fabricated in accordance with the present invention.

Referring specifically to FIG. 5, an organic semiconducting region 37 is formed on dielectric layer 15 between and partially overlying pair of current carrying contacts 30 to complete an organic TFT 40. Organic semiconducting region 37, control terminal 14 and current carrying terminals 30 can be formed in a variety of configurations but generally are positioned so that control terminal 14 is in contact with dielectric layer 15, organic semiconducting region 37 is in contact with dielectric layer 15, and current carrying terminals 30 are in contact with organic semiconducting region 37 and spaced on either side of control terminal 14.

Organic semiconducting region 37 generally includes at least one layer 42, which may include, for example, one of polyimide, polyphenylenevinylene, phtalocyanine, liquid crystal polymer, and sexithiophene with current carrying terminals 30 positioned in contact therewith. In organic TFTs, it is generally easier and better to form them as p-conduction, or p-channel, devices with the type of conduction being determined by the organic material, the material forming the electrical contact, or both. Therefore, in this preferred embodiment layer 42 is selected for p-conduction. Thus, an organic current channel 45 is defined between current carrying electrodes 30 and in overlying relationship to control electrode 14. Additional examples of different arrangements for the various components of organic TFTs and different layers of organic material can be found in copending U.S. patent application entitled "Organic Thin Film Transistor With Enhanced Carrier Mobility", Ser. No. 08/592,930, filed 29 Jan. 1996 and assigned to the same assignee.

Thus, inorganic TFT 35 and organic TFT 40 are formed on the same supporting substrate (10) at relatively low temperatures (generally below 300° C.) and utilizing many of the same process steps and materials. Because inorganic TFT 35 and organic TFT 40 are formed at such low temperatures, supporting substrate 10 can be formed of plastic, etc. Also, because of the materials utilized, the thermal coefficients of inorganic TFT 35 and organic TFT 40 are more compatible with plastic and the like. Control terminals 12 and 14 are formed in the same process step and utilizing the same material. Similarly, dielectric layer 15 operates as a control, or gate, insulator for both inorganic TFT 35 and organic TFT 40. Also, current carrying terminals 25 and 30 are formed in the same process step, utilizing the same material. Thus, it can be seen that the thin film transistor device, including inorganic TFT 35 and organic TFT 40, is fabricated using as few as one additional process steps. Further, inorganic TFT 35 and organic TFT 40 can be connected during the fabrication process to form a complementary pair, as illustrated schematically in FIG. 7.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a thin film transistor device comprising the steps of:

providing a supporting substrate; and forming an inorganic thin film transistor and an organic thin film transistor on the substrate, the inorganic thin film transistor including a first control terminal in contact with a dielectric layer, an inorganic semiconducting region in contact with the dielectric layer and a first pair of current carrying terminals in contact with the inorganic semiconducting region and spaced on either side of the first control terminal, and the organic thin film transistor including a second control terminal in contact with the dielectric layer, an organic semiconducting region in contact with the dielectric layer and a second pair of current carrying terminals in contact with the organic semiconducting region and spaced on either side of the second control terminal.

2. A method of fabricating a thin film transistor device as claimed in claim 1 wherein the first and second control terminals are formed in a common step.

3. A method of fabricating a thin film transistor device as claimed in claim 2 wherein the material of the first and second control terminals includes one of Al and TiW.

4. A method of fabricating a thin film transistor device as claimed in claim 1 wherein the dielectric layer includes one of SiOx, SiNx and AlOx, polyimides, polyacrylates, poly(vinyl chloride), perfluoropolymers and liquid crystal polymers.

5. A method of fabricating a thin film transistor device as claimed in claim 1 wherein the inorganic semiconducting region includes a layer of one of hydrogenated amorphous silicon (a-Si:H), amorphous silicon (a-Si), hydrogenated amorphous silicon carbide (a-SiC:H), amorphous diamond-like carbon, polysilicon, and cadmium selenide (CdSe).

6. A method of fabricating a thin film transistor device as claimed in claim 5 wherein the inorganic semiconducting region further includes a doped layer with the first pair of current carrying terminals positioned in contact therewith, and the doped layer includes one of hydrogenated amorphous silicon (a-Si:H), amorphous silicon (a-Si), hydrogenated amorphous silicon carbide (a-SiC:H), amorphous diamond-like carbon (a-c), polysilicon, and cadmium selenide (CdSe).

7. A method of fabricating a thin film transistor device as claimed in claim 1 wherein the organic semiconducting region includes a layer of one of polyimide, polyphenylenevinylene, phtalocyanine, liquid crystal polymer, and sexithiophene.

8. A method of fabricating a thin film transistor device as claimed in claim 1 wherein the first and second pair of current carrying terminals are formed in a common step.

9. A method of fabricating a thin film transistor device as claimed in claim 1 wherein the material forming the first and second pairs of current carrying terminals includes Au/Cr.

10. A method of fabricating a thin film transistor device as claimed in claim 1 including in addition fabricating the inorganic thin film transistor n-conducting and the organic thin film transistor p-conducting.

11. A method of fabricating a thin film transistor device as claimed in claim 1 wherein the step of providing the supporting substrate includes providing a supporting substrate of plastic.

12. A method of fabricating a thin film transistor device comprising the steps of:

forming first and second spaced apart control electrodes on a surface of a supporting substrate;

forming a dielectric layer over the control electrodes;

forming an inorganic semiconducting region on the dielectric layer, the inorganic semiconducting region defining an inorganic current channel in overlying relationship to the first control electrode;

forming an organic semiconducting region on the dielectric layer, the organic semiconducting region defining an organic current channel in overlying relationship to the second control electrode; and forming a first spaced apart pair of current carrying ohmic contacts engaged with the inorganic semiconducting region and positioned on opposite sides of the first control electrode and the inorganic current channel and a second spaced apart pair of current carrying ohmic contacts engaged with the organic semiconducting region and positioned on opposite sides of the second control electrode and the organic current channel.

13. A method of fabricating a thin film transistor device as claimed in claim 12 wherein the material of the first and second control terminals includes one of Al and TiW.

14. A method of fabricating a thin film transistor device as claimed in claim 12 wherein the dielectric layer includes one of SiOx, SiNx and AlOx, polyimides, polyacrylates, poly(vinyl chloride), perfluoropolymers and liquid crystal polymers.

15. A method of fabricating a thin film transistor device as claimed in claim 12 wherein the inorganic semiconducting region includes a layer of one of hydrogenated amorphous silicon (a-Si:H), amorphous silicon (a-Si), hydrogenated amorphous silicon carbide (a-SiC:H), amorphous diamond-like carbon, polysilicon, and cadmium selenide (CdSe).

16. A method of fabricating a thin film transistor device as claimed in claim 15 wherein the inorganic semiconducting region further includes a doped layer with the first pair of current carrying ohmic contacts positioned in contact therewith, and the doped layer includes one of hydrogenated amorphous silicon (a-Si:H), amorphous silicon (a-Si), hydrogenated amorphous silicon carbide (a-SiC:H), amorphous diamond-like carbon, polysilicon, and cadmium selenide (CdSe).

17. A method of fabricating a thin film transistor device as claimed in claim 16 wherein the doped layer is n-doped.

18. A method of fabricating a thin film transistor device as claimed in claim 12 wherein the organic semiconducting region includes a layer of one of polyimide, polyphenylenevinylene, phtalocyanine, liquid crystal polymer, and sexithiophene.

* * * * *